(12) United States Patent  (10) Patent No.: US 8,376,166 B2
Kindig et al.  (45) Date of Patent: Feb. 19, 2013

(54) STRUCTURAL MEMBER FOR ENCLOSURE

(75) Inventors: Michael A. Kindig, Chagrin Falls, OH (US); Jeremie Buday, Lakewood, OH (US)

(73) Assignee: Lincoln Global, Inc., City of Industry, CA (US)

( * ) Notice: Subject to any disclaimer, the term of this patent is extended or adjusted under 35 U.S.C. 154(b) by 1325 days.

(21) Appl. No.: 12/111,601

(22) Filed: Apr. 29, 2008

(65) Prior Publication Data
US 2009/0269131 A1 Oct. 29, 2009

(51) Int. Cl.
*B65D 6/28* (2006.01)
(52) U.S. Cl. ............ 220/4.02; 220/4.03; 220/4.28
(58) Field of Classification Search ......... 403/404; 52/281, 656.1; 220/4.02, 4.03, 4.28
See application file for complete search history.

(56) References Cited

U.S. PATENT DOCUMENTS

| | | | | |
|---|---|---|---|---|
| 967,383 A * | 8/1910 | Hunter | 248/220.1 |
| 2,317,634 A * | 4/1943 | Olsen | 52/242 |
| 3,381,430 A * | 5/1968 | Wiczer | 52/282.3 |
| 3,477,182 A * | 11/1969 | Fulton | 52/28 |
| 3,751,127 A * | 8/1973 | Black et al. | 312/111 |
| 3,782,048 A * | 1/1974 | Corman | 52/282.2 |
| 3,836,043 A | 9/1974 | Levin | |
| 3,974,616 A * | 8/1976 | Beckley | 52/656.1 |
| 4,021,129 A * | 5/1977 | Sykes | 403/252 |
| D265,035 S * | 6/1982 | Fether et al. | D8/403 |
| 4,385,850 A * | 5/1983 | Bobath | 403/205 |
| 4,430,833 A | 2/1984 | Balzer et al. | |
| 4,490,064 A * | 12/1984 | Ducharme | 403/255 |
| 4,689,930 A * | 9/1987 | Menchetti | 52/277 |
| 4,706,426 A | 11/1987 | Rumsey | |
| 4,731,973 A * | 3/1988 | Stenemann | 52/767 |
| 4,768,845 A * | 9/1988 | Yeh | 312/257.1 |
| 4,817,902 A | 4/1989 | Mason | |
| 4,840,440 A * | 6/1989 | Dieter | 312/140 |
| 4,884,715 A * | 12/1989 | Pohlmann | 220/683 |
| D306,491 S * | 3/1990 | Hallengren | D25/124 |
| 4,999,961 A * | 3/1991 | McNary | 52/287.1 |
| 5,000,301 A * | 3/1991 | Grenier | 190/127 |
| 5,022,719 A * | 6/1991 | Amstutz et al. | 312/140 |
| 5,487,690 A * | 1/1996 | Stoffle et al. | 446/105 |
| 5,503,471 A * | 4/1996 | Aspenwall | 312/140 |
| 5,647,182 A | 7/1997 | Rutherford | |
| 6,125,488 A | 10/2000 | Vogland et al. | |
| 6,138,413 A * | 10/2000 | Fehr | 49/382 |
| 6,341,458 B1 * | 1/2002 | Burt | 52/287.1 |
| 6,354,049 B1 | 3/2002 | Bennett | |
| 6,419,331 B2 * | 7/2002 | Wei | 312/265.1 |
| D472,333 S * | 3/2003 | Shaw | D25/121 |
| 6,881,469 B2 | 4/2005 | Hightower | |

(Continued)

OTHER PUBLICATIONS

ESAB AB, Aristo(TM) Mig U4000i/U5000i, http://www.esab.com.ar/ar/sp/productos/upload/AristoMig_U5000_4000i.pdf, Nov. 7, 2006 (printed on Aug. 12, 2008), 2 pages.

(Continued)

*Primary Examiner* — Anthony Stashick
*Assistant Examiner* — Christopher McKinley
(74) *Attorney, Agent, or Firm* — Hahn Loeser & Parks LLP

(57) ABSTRACT

An enclosure includes wall members connected together by structural members forming joints of the enclosure. The structural members may be extruded from aluminum or other generally rigid material and may comprise a series of mounting channels and fastener channels to which the internal components of the enclosure may be mounted.

14 Claims, 3 Drawing Sheets

U.S. PATENT DOCUMENTS

| | | | |
|---|---|---|---|
| 6,935,085 B2 * | 8/2005 | Little, Jr. | 52/762 |
| D525,372 S * | 7/2006 | Levi-Senigaglia | D25/121 |
| 7,096,637 B2 * | 8/2006 | McMillan | 52/653.1 |
| 7,159,370 B2 * | 1/2007 | Oliphant et al. | 52/845 |
| 7,168,208 B2 | 1/2007 | Ward | |
| 7,264,863 B2 * | 9/2007 | Haymond | 428/99 |
| D553,761 S * | 10/2007 | Antonic | D25/122 |
| 7,322,770 B2 * | 1/2008 | Frank | 403/253 |
| 7,802,408 B2 * | 9/2010 | Asbury | 52/282.4 |
| 7,900,411 B2 * | 3/2011 | Antonic | 52/275 |

OTHER PUBLICATIONS

MIGATRONIC, Sigma 300/400/500 Professional Welding-Surprisingly Simple, http://www.migatronic.com/media/leafletsuk/52170032a_sigma.pdf, printed on Aug. 12, 2008, 8 pages.

\* cited by examiner

STRUCTURAL MEMBER FOR ENCLOSURE

TECHNICAL FIELD

The present invention pertains to structural members for enclosures, and more particularly to enclosures housing equipment having extruded structural members for supporting internal components.

BACKGROUND OF THE INVENTION

It is well known to construct industrial equipment housed internally within an enclosure. The enclosure usually includes an outer sheet metal cover, configured and painted to match the products branding. The cover is fastened to a base that may also support the internal components of the unit. The enclosure provides protection of the internal components mounted inside, shielding them from certain ambient conditions.

The internal components of the equipment can vary extensively. In some cases, the components are used to control machinery or produce some output based on its makeup, which may be mechanical and/or electrical in nature. One example may include a machine controller. Another more specific example may include a welding power source. In this case, the internal components control output power made available through studs for establishing and maintaining a welding arc.

Typically the internal components and output interface are mounted directly to the base or sheet metal covers. For equipment incorporating large, and more particularly heavy components, mounting space may be limited to the region around the base. Examples of these types of components can include transformers or chokes. In some circumstances, a rack may be erected within the enclosure. The rack provides a separate structure for mounting the internal components. But, the rack itself takes up space within enclosure and adds to the overall weight of the unit. Alternatively, some components are mounted directly to the sheet metal covers itself often resulting in the formation of dimples from buckling of the sheet metal.

What is needed is a rigid structural member for enclosures that itself forms part of the enclosure shell, but also provides means for mounting the internal components of the equipment, as well as other cover members. One purpose of this invention is to provide such an arrangement with its various attendant advantages. Other uses will become apparent to those skilled in the art.

BRIEF SUMMARY

The embodiments of the present invention pertain to structural members for use with an enclosure used to mount one or more internal components. The structural members may include a first structural member section having a generally tubular cross section, one or more generally longitudinal fastener channels spaced radially apart in a substantially parallel relationship to the first structural member section, and wherein the first structural member section and one or more generally longitudinal fastener channels are contiguously formed as a unitary structural member.

In one aspect of the embodiments of the subject invention, the structural member is extruded and may be constructed from a metal or metal alloy, such as aluminum.

In another aspect of the embodiments of the subject invention, the one or more generally longitudinal fastener channels define an open edge and have sufficient wall thickness for receiving an associated threaded fastener.

In yet another aspect of the embodiments of the subject invention, the associated threaded fastener is infinitely positionable within the one or more generally longitudinal fastener channels.

In still another aspect of the embodiments of the subject invention, the open edge of the one or more generally longitudinal fastener channels is oriented to face outward with respect to the interior of the associated enclosure.

In the structural member of the embodiments of the subject invention, the one or more generally longitudinal fastener channels include a first fastener channel and at least second a fastener channel each defining a transverse axis, wherein the transverse axis of the first fastener channel is skewed with respect to the transverse axis of the at least a second fastener channel.

In another embodiment of the subject invention, an enclosure defining a rigid enclosure shell for supporting one or more internal components includes at least a first structural member having a first tubular section that comprises part of the enclosure shell and means for operatively mounting the associated one or more internal components, said means for operatively mounting being spaced radially apart from the tubular section, and wherein said means for operatively mounting is contiguously fashioned with the tubular section, and one or more wall members affixed with respect to the tubular section.

In one aspect of the embodiments of the subject invention, the at least a first structural member includes a second tubular section disposed between the first tubular section and said means for operatively attaching.

In another aspect of the embodiments of the subject invention, the at least a first structural member is a unitary structural member.

In yet another embodiment of the subject invention, an enclosure for encasing one or more associated internal components includes multiple generally planar and rigid wall panels, a plurality of hollow core, extruded structural members disposed at respective corners of the enclosure for adjoining to the multiple generally planar and rigid wall panels, the plurality of extruded structural members having a surface portion that defines part the exterior surface of the enclosure, and where the plurality of hollow core, extruded structural members include two or more U-shaped channels having respective open edges for receiving threaded fasteners used to mount the one or more internal components, the two or more U-shaped channels being generally elongate and oriented at substantially different angles for mounting the one or more associated internal components.

DETAILED DESCRIPTION OF THE INVENTION

Figure 1:
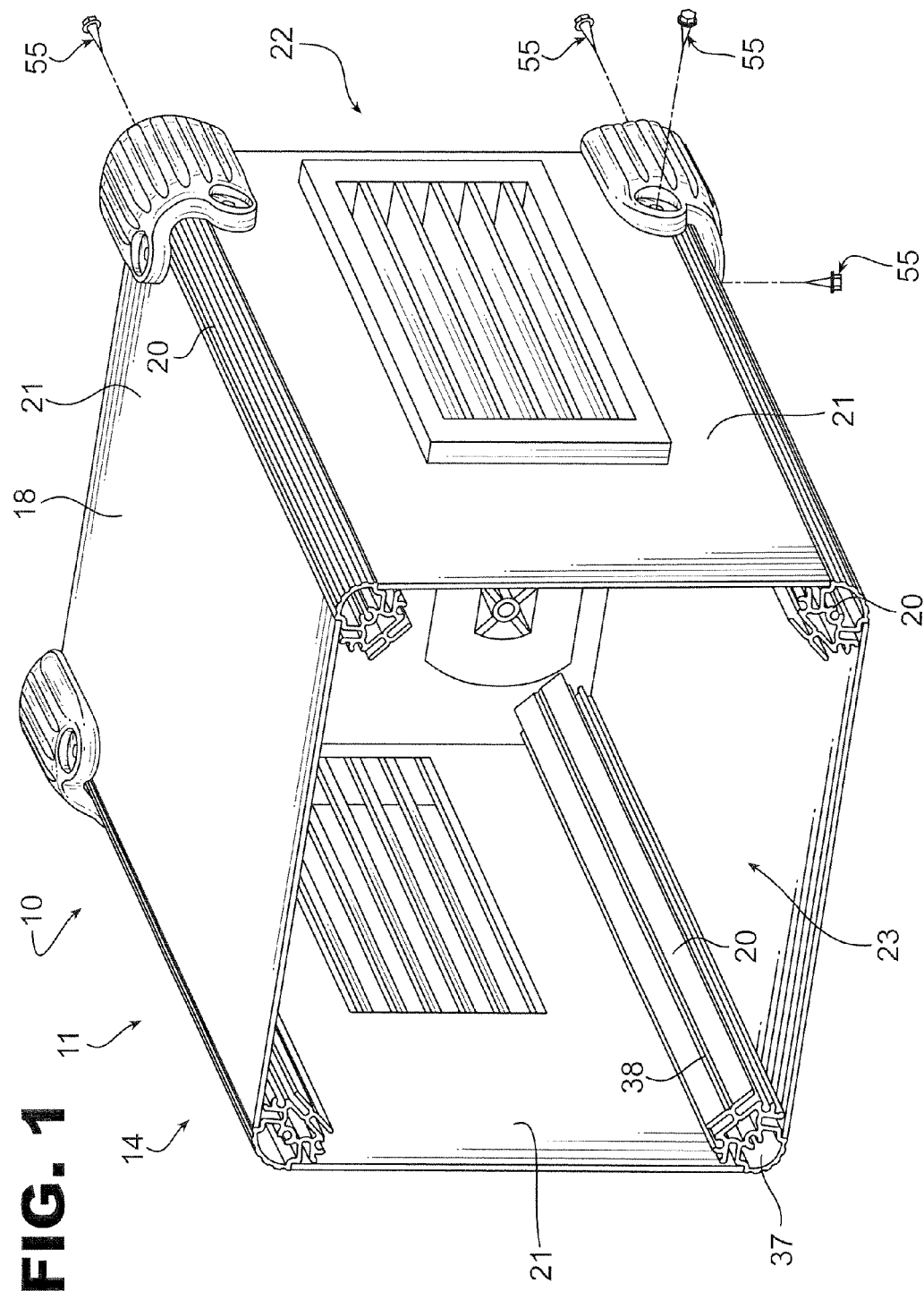
FIG. 1 is a perspective view of an enclosure housing one or more components according to the embodiments of the subject invention.

Referring now to the drawings wherein the showings are for purposes of illustrating embodiments of the invention only and not for purposes of limiting the same, FIG. 1 shows an enclosure depicted generally at 10. The enclosure 10 may be used to house a plurality of components configured to perform a particular operation. The enclosure 10, and associated components, may form a part of machine or may comprise an article of equipment, like for example a machine controller or a welding power source. Although it will be appreciated that the enclosure 10 may house any type and/or quantity of components, mechanical or electrical in nature, without departing from the intended scope of coverage of the embodiments of the subject invention. In one embodiment, the enclosure 10 may consist of a housing or shell 11 for a welding power source 14. As such, the components housed within the shell 11 may include one or more circuit boards, not shown, that function to condition and control power used to establish a welding arc.

With continued reference to FIG. 1, the enclosure 10 can be constructed from one or more wall members 18 held together at its edges by structural members 20. The wall members 18 may form a substantially boxlike enclosure 10 having sides 21 and ends 22 defining an enclosed interior region 23 in which the components of the enclosure 10 may be mounted. In this manner, the wall members 18 may be oriented at substantially right angles. However, the particular configuration of the enclosure 10 is not to be construed as limiting. Rather the wall members 18 may be fashioned to form any shape of enclosure 10 as chosen with sound engineering judgment.

The wall members 18 may be constructed from a rigid material. Examples of rigid material may include metal or metal alloys, such as steel sheet metal. Other types of materials may also be used, including but not limited to polymers that have sufficient rigidity to maintain the structure of the enclosure 10 when the various components are mounted within its interior. Slots, holes or other apertures may be formed within the wall members 18 as may be necessary for constructing an article of equipment.

Figure 2:
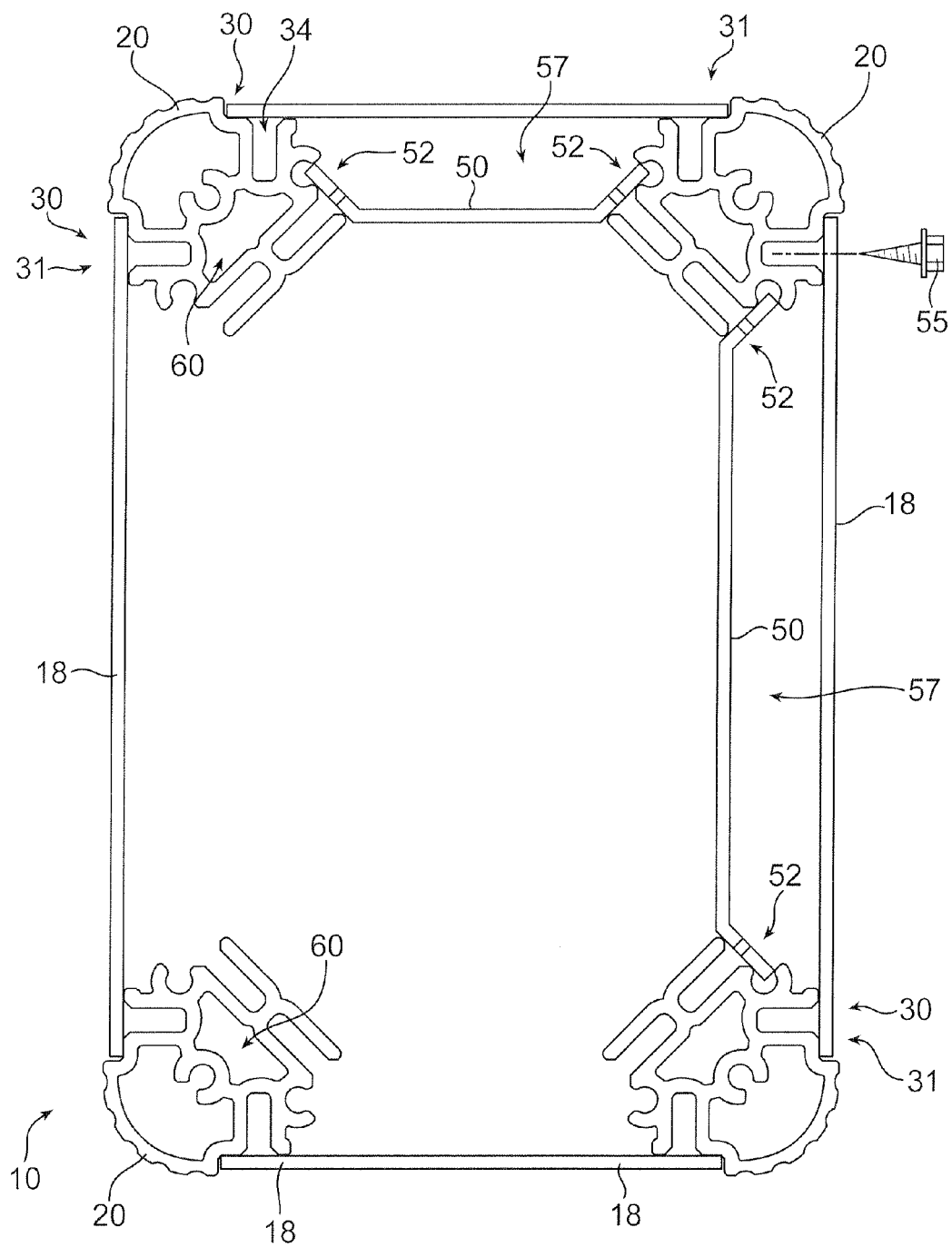
FIG. 2 is a cross-sectional view of an enclosure according to the embodiments of the subject invention.

With reference to FIGS. 1 and 2, structural members 20 may be used to join the wall members 18 together thereby forming joints of the enclosure 10. More specifically, the wall members 18 may be affixed to the structural members 20 by fasteners or any other means suitable for constructing a generally rigid enclosure 10. Accordingly, the structural numbers 20 may also be substantially rigid having a length corresponding dimensionally to the length of the wall members 18. In one embodiment, the structural members 20 may be constructed from aluminum. Although it will be apparent to those skilled in the art that other types of rigid material may be used. For fastening the wall members 18 together, the structural members 20 may include seats 30 disposed at distal edges of the structural member 20. The seats 30 are formed from recesses or steps 31 fashioned in an outer surface of the structural members 20 and may be juxtaposed to one or more mounting channels 34 configured to receive fasteners. One of ordinary skill in the art will recognize that the fasteners may extend through the wall members 18 and into the mounting channel 34 for fixedly attaching the members 18, 20 together.

Figure 3:
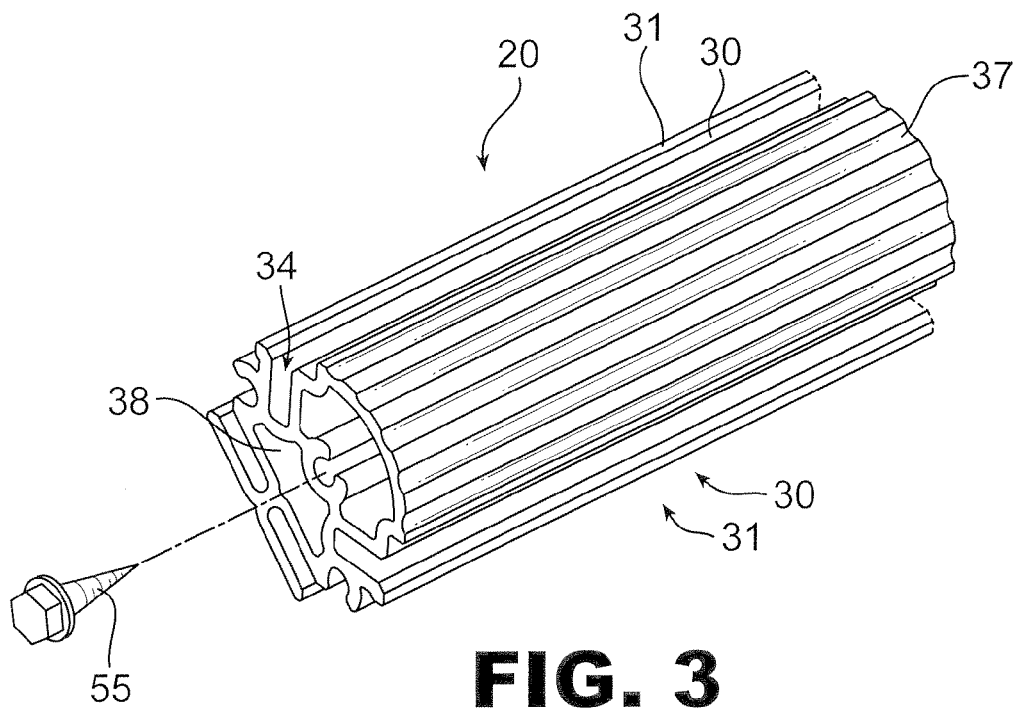
FIG. 3 is a perspective view of the structural member according to the embodiments of the subject invention.

With reference now to FIG. 3, as mentioned above, the structural members 20 may be comprised of a substantially rigid material. Aluminum is just one example of rigid material. Other metals or metal alloys may also be used to make the structural members 20. Furthermore, any type of rigid material may be used to make the structural members 20 including but not limited to polymers or fibrous material. In one embodiment, the structural members 20 may be manufactured by an extrusion process. During extrusion, softened material may be passed through the face of a die having a particular cross-section. The material takes on the shape of the die and may be manufactured to any length chosen with sound engineering judgment. In this manner, the structural numbers 20 may be generally longitudinal having a specific and uniform cross-section substantially along its entire length.

Figure 3A:
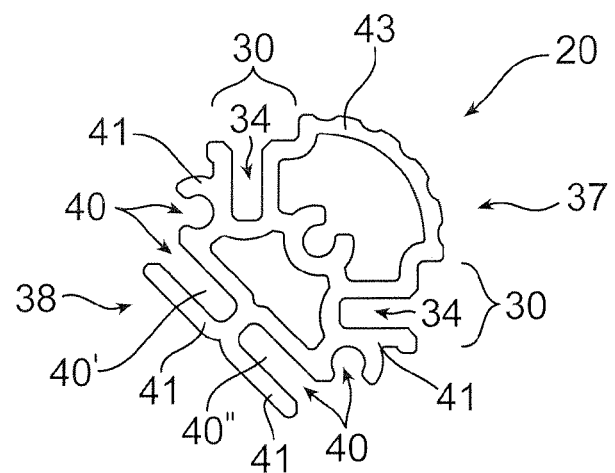
FIG. 3a is an end view of the structural member according to the embodiments of the subject invention.

One exemplary cross-sectional configuration of the structural members 20 is illustrated in FIG. 3a. In this embodiment, the structural member 20 may be comprised of first and second structural member sections 37, 38. The first and second structural member sections 37, 38 may be defined by cross-sectional regions of the structural member 20. Namely, the first structural member section 37 may be defined as having an enclosed annular portion including a quarter round exterior 43. It will be appreciated the annular portion defines a first tubular portion of the structural member 20. In a manner consistent with that described above, the quarter round exterior 43 is fashioned between the recesses or seats 30 used to connect with the wall members 18. It should be recognized that the quarter round exterior 43 forms part of the exterior surface of the enclosure 10.

The second structural member section 38 includes a series of fastener channels 40 used to attach various internal components of the enclosure 10. The fastener channels 40 may be spaced laterally or radially apart from the first structural member section 37. In this way, the fastener channels 40 extend into the interior of the enclosure. The fastener channels 40 comprise channel walls 41, which may include an open edge. The channel walls 41 have a thickness T of sufficient width to receive and hold one or more fasteners 55, similar to that shown in FIG. 2 for the mounting channel 34. In an exemplary manner, the fastener channels may be U-shaped or C-shaped. Combinations of the differently shaped fastener channels 40 may also be incorporated into the structural member 20. The fasteners used to mount the internal components to the fastener channels 40 may comprise threaded bolts or screws. However, other types of fasteners may also be used as chosen with sound engineering judgment.

With continued reference to FIG. 3a and again to FIG. 2, the fastener channels 40 may be oriented for convenient assembly and mounting of the internal components within the enclosure 10. For example, a first U-shaped channel 40' may be oriented such that the opening of the channel is angled in a direction facing the exterior of the enclosure 10. Stating it another way, the U-shaped channel may define a transverse axis which forms an acute angle with a central axis of the enclosure and wherein the opening of the U-shaped channel 40' faces the exterior of the enclosure 10. In one embodiment, first and second U-shaped channels 40' and 40" may be incorporated wherein the respective openings of each of the channels 40' and 40" face outward in opposite directions. It will be appreciated by those skilled in the art, that the angled orientation of the fastener channels 40 provide easy access for tools that may be used to secure the fasteners, and corresponding internal components, to the structural members 20. Additionally, C-shaped channel numbers may further be incorporated having respective open edges facing any direction chosen with sound engineering judgment. In general, U-shaped channel members may receive fasters inserted radially with respect to the longitudinal axis of the structural member 20, while C-shaped may receive fasters inserted axially with respect to the same axis. However, it is to be construed that any angle of inserting a fastener into the fastener channels 40 may be chosen with sound engineering judgment.

FIG. 2 illustrates just one manner of mounting internal components to the structural members 20 of the enclosure 10. Others will be appreciated by those skilled in the art. Brackets 50 may be included having ends 52 configured for attaching to the fastener channels 40. In an exemplary manner, the ends 52 of the brackets 50 may be angled. Additionally, holes may be drilled in the ends 52 of the brackets for receiving fasteners in a manner consistent with that described above. The central portion 57 of the brackets 50 may be generally planar to which the internal components may be mounted. However, any configuration of brackets 50 may be chosen as is appropriate for use with the embodiments of the subject invention. It is to be construed that the internal components of the enclosure 10 may, either separately or in addition to, be mounted directly to the mounting channels 40. It will be recognized that the height of the brackets 50 may be adjusted depending on the application. In one embodiment, the brackets 50 may be relatively narrow. Accordingly multiple brackets may be disposed at different elevations within the enclosure. It is noteworthy to mention that the substantially uniform cross-section of the structural members 20 allows an operator to mount the brackets 50 in any position along the structural numbers longitudinal axis.

With continued reference to FIG. 2, in another embodiment the first and second structural member sections 37, 38 may be separated by a second tubular portion 60. The second tubular portion 60 may or may not include fastener channels. However, one or more wall sections of the second tubular portion 60 may form part of an adjacent fastener channel 40. In this manner, the structural member comprises a double boxed configuration for increased strength and rigidity in constructing the enclosure 10.

The invention has been described herein with reference to the disclosed embodiments. Obviously, modifications and alterations will occur to others upon a reading and understanding of this specification. It is intended to include all such modifications and alterations insofar as they come within the scope of the appended claims or the equivalence thereof.

What is claimed is:

1. A structural member for an enclosure, comprising:
   a first structural member section having a generally tubular cross section and at least a partially closed interior channel disposed longitudinally within said first structural member;
   a pair of generally U-shaped, outwardly facing longitudinal fastener channels spaced radially apart in a substantially parallel relationship to the first structural member section, an interior wall of each U-shaped channel having a recessed ledge and an exterior wall of each U-shaped channel having a depth essentially equal to said opposed interior wall;
   a second structural member section having a tubular cross-sectional area integrally disposed interiorly between the first structural member section;
   said second structural member section having a pair of opposed interiorly positioned U-shaped fastener channels positioned at a bottom of said second structural member;
   one or more brackets which interface with said interiorly positioned U-shaped fastener channels; and,
   wherein the first and second structural member sections and one or more generally longitudinal fastener channels are contiguously formed as a unitary structural member.

2. The structural member as defined in claim 1, wherein the structural member is extruded.

3. The structural member as defined in claim 1, wherein the structural member is constructed from a metal or metal alloy.

4. The structural member as defined in claim 1, wherein the structural member is constructed from aluminum.

5. The structural member as defined in claim 1, wherein the pair of generally U-shaped, outwardly facing longitudinal fastener channels define an opening having sufficient wall thickness for receiving an associated threaded fastener.

6. The structural member as defined in claim 5, wherein the associated threaded fastener is infinitely positionable within the pair of generally U-shaped, outwardly facing longitudinal fastener channels.

7. The structural member as defined in claim 1, wherein the at least a partially closed interior channel disposed longitudinally within said first structural member has a C-shaped cross section having sufficient wall thickness for receiving a fastener axially with respect the longitudinal axis of the first generally longitudinal fastener channel, and wherein the pair of generally U-shaped, outwardly facing longitudinal fastener channels have sufficient wall thickness for receiving a fastener radially with respect to the longitudinal axis of the pair of longitudinal fastener channels.

8. An enclosure defining a rigid enclosure shell for supporting one or more associated internal components, comprising:
   at least a first structural member having a first tubular section that comprises part of the rigid enclosure shell, said first structural member having a pair of radially-spaced, exteriorly-facing U-shaped channels on opposed sides of an curvilinear exterior portion of said first structural member, an interior of said first tubular section having an at least partially closed channel disposed longitudinally within said first structural member;
   said first structural member further comprising a pair of oppositely facing, interiorly positioned U-shaped channels disposed opposite said curvilinear section of said first structural member;
   a means for operatively mounting the one or more associated internal components by use of one or more brackets which interface with said interiorly positioned U-shaped channels,
   a means for operatively mounting said brackets with said interiorly positioned U-shaped channels, said means for operatively mounting being spaced radially apart from the first tubular section, and wherein
   said means for operatively mounting is contiguously fashioned with the first tubular section; and,
   one or more wall members affixed with respect to the first tubular section by fasteners which interface with said radially-spaced, exteriorly-facing U-shaped channels on opposed sides of said curvilinear exterior portion of said first structural member, and further wherein
   the at least a first structural member further comprises a second tubular section disposed between the first tubular section and said pair of oppositely facing, interiorly positioned U-shaped channels disposed at a bottom of said second tubular section for interfacing with said brackets.

9. The enclosure as defined in claim 8, wherein the at least a first structural member is a unitary structural member.

10. The enclosure as defined in claim 8, wherein the at least a first structural member is extruded.

11. The enclosure as defined in claim 8, wherein said pair of radially-spaced, exteriorly-facing U-shaped channels on opposed sides of a curvilinear exterior portion of said first structural member comprises:
- a pair of channels having wall sections configured to receive a threaded fastener.

12. The enclosure as defined in claim 8, wherein
said exteriorly-facing U-shaped channels and said interiorly-positioned U-shaped channels have respective openings that each face outward at different angles of orientation.

13. The enclosure as defined in claim 11, further comprising:
- first and second first structural members disposed at distal ends of the enclosure; and,
- the one or more brackets mounted to the at least a first channel, wherein the one or more associated internal components are fastened directly to the one or more brackets.

14. The enclosure as defined in claim 13, wherein
the one or more brackets are infinitely positionable along the length of the at least a first channel.

* * * * *